United States Patent [19]

Kim

[11] 3,983,395
[45] Sept. 28, 1976

[54] MIS STRUCTURES FOR BACKGROUND REJECTION IN INFRARED IMAGING DEVICES

[75] Inventor: James C. Kim, Liverpool, N.Y.

[73] Assignee: General Electric Company, Syracuse, N.Y.

[22] Filed: Nov. 29, 1974

[21] Appl. No.: 528,582

[52] U.S. Cl. .............................. 250/370; 250/211 R; 250/338; 357/24; 357/30
[51] Int. Cl.² ..................... G01T 1/22; H01L 27/14
[58] Field of Search ............ 357/24, 30; 307/221 D; 250/333, 370, 211 J, 211 R, 338

[56] References Cited
UNITED STATES PATENTS

| | | | |
|---|---|---|---|
| 3,771,149 | 11/1973 | Collins et al. | 357/30 |
| 3,840,740 | 10/1974 | Stewart | 357/30 |
| 3,876,952 | 4/1975 | Weimer | 307/221 D |
| 3,882,531 | 5/1975 | Michon | 357/30 |
| 3,890,633 | 6/1975 | Kosonocky | 357/30 |

Primary Examiner—Harold A. Dixon
Attorney, Agent, or Firm—Richard V. Lang; Carl W. Baker; Frank L. Neuhauser

[57] ABSTRACT

An infrared imager having (1) sensing sites comprised of three MIS capacitors, one being an optically sensitive receiver capacitor, a second being an optically insensitive transfer capacitor, and a third being an optically insensitive storage capacitor; and (2) storage control circuit for cycling said sensing sites through a plurality of storage cycles, each cycle comprised of transferring a signal charge from said receiver capacitor to the storage capacitor, prior to readout of the stored signal charge, which is substantially free of background charge, from said optically insensitive storage capacitor using either charge-injection device (CID) or charge-coupled device (CCD) techniques.

6 Claims, 11 Drawing Figures

MIS STRUCTURES FOR BACKGROUND REJECTION IN INFRARED IMAGING DEVICES

The invention herein described was made under a contract or subcontract thereunder, (or grant) with the United States Army Night Vision Laboratory.

BACKGROUND OF THE INVENTION

This invention relates to imaging devices and, more particularly, to solid state infrared (IR) imaging devices.

Heretofore, problems have been incurred in IR imagers because of the extremely high level of background radiation (relative to level of IR "signal" radiation) which is encountered in the IR region of the spectrum. This has made IR imaging difficult because the background radiation tends to mask the IR signal radiation and results in an output signal having a low signal-to-noise ratio.

Also, solid state IR imagers now known have a limited dynamic range due to the relatively short integration times now possible with prior art imagers. This condition results from the fact that the target array sensing sites reach their saturation level in a very short time due to the high levels of background radiation.

One approach to the resolution of these problems is represented by U.S. Pat. No. 3,840,740 issued on Oct. 8, 1974, to Stewart and assigned to the assignee of the invention herein. The approach taken here was to provide a solid state imager having a control circuit to separate background and signal charge within each sensing site so that the signal charge could be read out independently of the background charge. The performance of IR imagers constructed in accordance with this patent, while improved, still has a sensing site integration time which is primarily determined by the level of background radiation and the saturation level of the sensing site.

Another approach is represented by U.S. Pat. No. 3,806,729 issued on Apr. 23, 1974, to Caywood. The Caywood patent is directed to an imager which is capable of separating a composite charge generated by exposing the image to radiation from a scene into a signal-charge component and a background-charge component by alternatively exposing an array of CCD sensing sites to a scene and to a source of background radiation and coupling the composite scene-related charge and the background-related charge to a differential detector, thereby eliminating background-charge component from the differential detector output. This approach still, however, provides an imager which has an integration time and dynamic range limited by the level of background radiation and the saturation level of the CCD sensing site initially receiving the incident radiation.

Accordingly, it is an object of this invention to provide an IR imager having a improved dynanic range, and an integration time which are not limited by the level of background radiation.

These and other objects will be apparent from a consideration of the following detailed description and accompanying claims.

SUMMARY OF THE INVENTION

In carrying out the objects of this invention, an infrared imager is provided having (1) sensing sites comprised of three MIS capacitors, one being an optically sensitive receiver capacitor, a second being an optically insensitive transfer capacitor, and a third being an optically insensitive storage capacitor, and (2) a storage cycle control circuit for cycling said sensing sites through a plurality of storage cycles, each cycle comprised of transferring a signal charge from the receiver capacitor to the storage capacitor prior to read-out of a stored signal charge, which is substantially free of background charge, from said optically insensitive storage capacitor.

DESCRIPTION OF THE INVENTION

The structure of an MIS (metal-insulator-semiconductor) capacitor operating as a charge injection device (CID) is fully described in Michon U.S. Pat. No. 3,786,263, the disclosure of which is hereby incorporated by reference herein. For clarity, the operation of such devices is described briefly hereinbelow in connection with FIGS. 1A, 1B, and 1C.

Figure 1A:
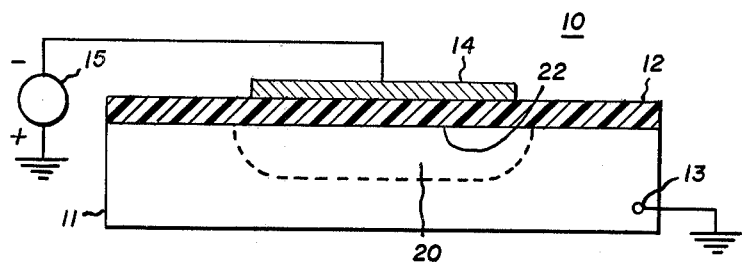
FIGS. 1A, 1B, and 1C are schematic diagrams of a time-sequenced operation of a charge-injection-device (CID) MIS storage capacitor.

Referring now to FIG. 1A, electrical charge corresponding to the intensity of a radiation source can be stored in an appropriately biased semiconductor substrate of an MIS capacitor 10. The MIS capacitor 10 is comprised of (1) a semiconductor substrate 11 such as, for example, N-type InSb; (2) an insulating oxide layer 12 of a suitable material such as silicon oxynitride (SiON) deposited on substrate 11; and (3) a metallic conductor plate 14 deposited on oxide layer 12. Plate 14 is biased to form a depletion region 20 in substrate 11 by the application of a negative potential from a source 15.

Figure 1B:
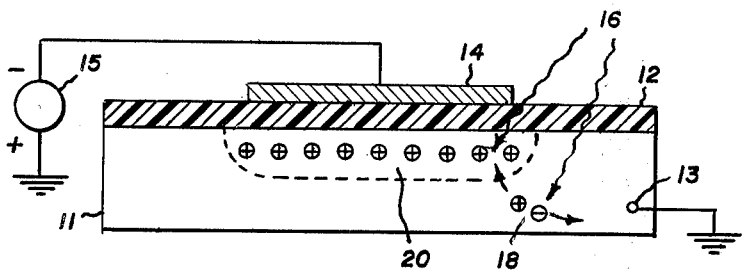
Figure 1C:
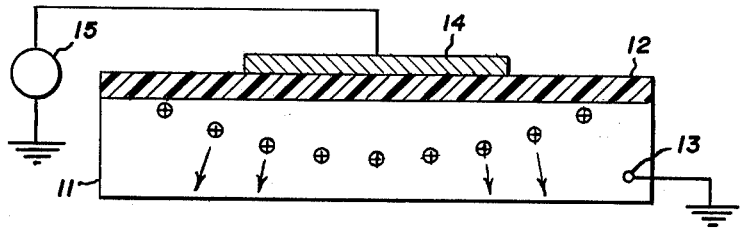

In FIG. 1B, the after biasing of plate 14, photons 16 incident on the cell 10 result in the creation of electron-hole pairs 18. During an appropriate integration time interval, the minority carriers, holes in an N-type material, are collected and stored in the depletion region 20 to form an inversion layer, which in turn reduces the width of region 20. The quantity of stored charge is proportional to the time integral of the applied phantom flux. As shown in FIG. 1C, the stored charges in the depletion region 20 are read out by reducing the bias voltage on plate 14 to zero, causing the injection of the stored charges into the substrate 11. The magnitude of the stored charge is determined by measuring the amount of displacement current injected from a contact 13 to maintain charge neutrality in the substrate 11. Such structures, as is well known, can be used to form a one-dimensional sensing array imager.

For read-out from a two-dimensional CID sensing array, two MIS capacitors (X-Y) are provided in each storage site. Such configurations are illustrated and described in the aforementioned Michon patent (e.g., Column 8, line 49 through Column 9, line 62, Column 13, line 44 through Column 15, line 42, and Column 24, lines 1–68) and more fully described hereinbelow.

The features of this invention will be now described in accordance with a two-dimensional sensing site array of MIS capacitors. It will, of course, be understood that this is only as illustrative embodiment of the invention and that a one-dimensional array can be similarly constructed.

Figure 2:
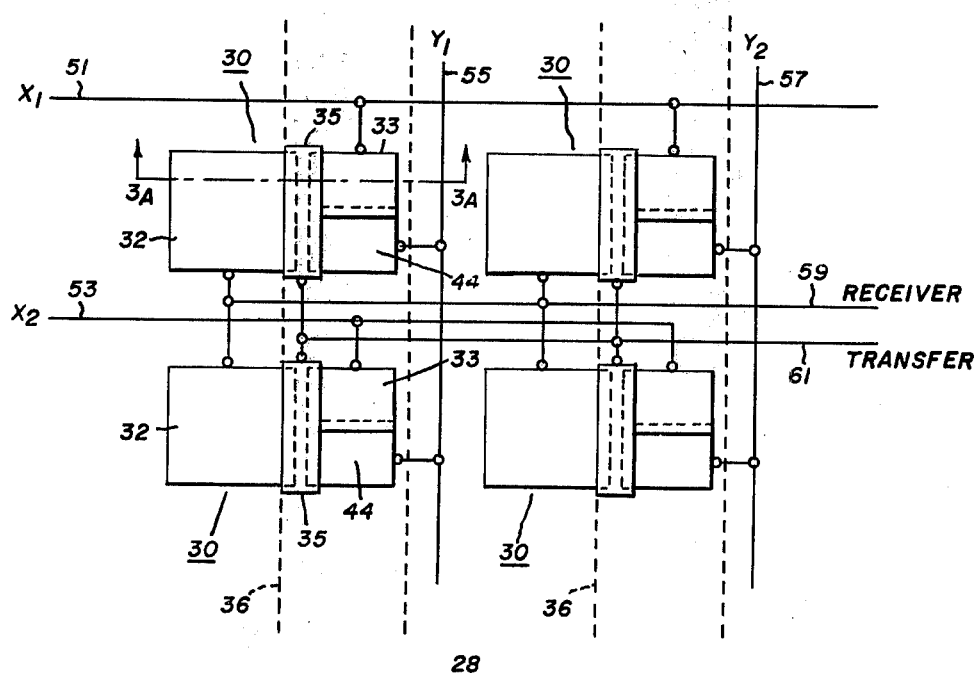
FIG. 2 is a schematic diagram of a portion of a CID sensing array (N × M) of MIS sensing sites constructed in accordance with the features of this invention.

Illustrating an example of a two-dimensional sensing array which can be constructed of N rows and M columns, a two-by-two section of such an array 28 is shown in FIG. 2. The operation of array 28 permits the storage and sequential read-out of charge in each sensing site 30 comprised of four MIS capacitors, a receiver capacitor 32, a transfer capacitor 35, an X storage capacitor 33, and a Y storage capacitor 44, respectively, all capacitors being of the type shown in FIG. 1.

As is conventional in a two-dimensional CID array, the sensing sites are arranged in rows and columns. The rows are defined by terminal line means 51 and 53 which are connected to the X storage capacitores 33 in rows $X_1$ and $X_2$, respectively. Similarly, columns of the arry 28 are defined by terminal line means 55 and 57 which are connected to the Y storage capacitors 44 of columns $Y_1$ and $Y_2$, respectively. The terminal line means 51, 53 permit the simultaneous and equal biasing of all X storage capacitors 33 in any one row upon a bias being applied to that row; and similarly the Y storage capacitors in any one column are simultaneously and equally biased by the application of the bias to that one column.

Additionally, the terminal line means 59 and 61 are connected to all receiver and transfer capacitors 32, 35, respectively, to permit the equal and simultaneous biasing of all receiver capacitors 32 of array 28 to the appropriate voltage and of all transfer capacitors 35 of array 28 to the appropriate voltage as is explained in more detail below.

In accordance with the invention herein, the charge which is read out from a sensing site 30 is ideally created and stored in sensing site 30, responsive only to radiation incident on receiver capacitor 32. This is accomplished by an opaque coating 36 of a material, such as aluminum or gold, which covers (but electrically isolates from) transfer capacitor 35 and X and Y storage capacitors 33, 44, and the surrounding region, thereby to make reciver capacitor 32 optically sensitive and X and Y storage capacitors optically insensitive. It will, of course, be recognized by those skilled in the art that charge created and stored in site 30 responsive to dark leakage current is unavoidable. However, it is assumed that dark leakage current is much smaller than the current generated by background radiation and, therefore, can be disregarded for the purposes of the description.

Figure 3A:
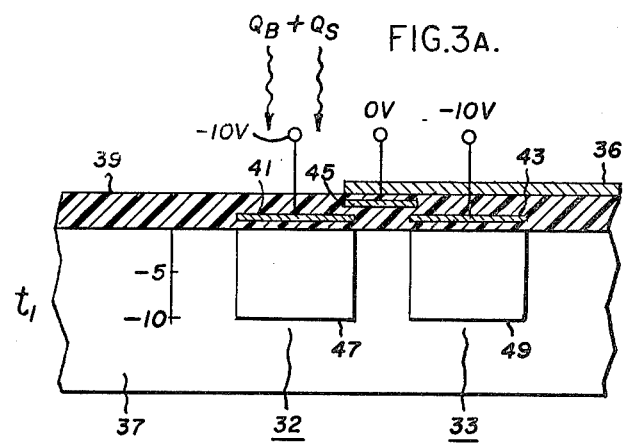
FIGS. 3A–3E are potential well, schematic diagrams of a cross-section of one sensing site taken along line 3A—3A of FIG. 2.
Figure 3B:
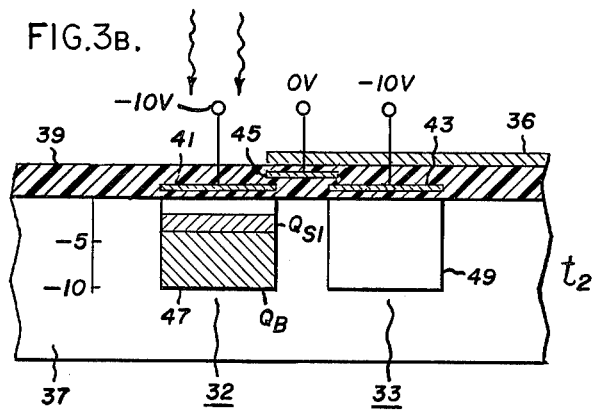
Figure 3C:
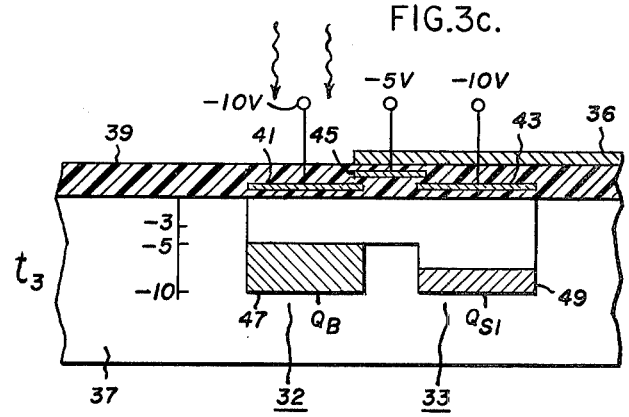
Figure 3D:
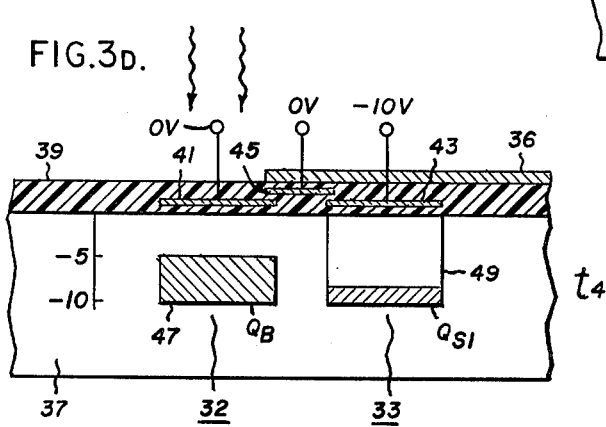

FIGS. 3A–3E depict the structure (viewed in a cross-section taken along line 3A–3A) and operation in the time sequence of a sensing site 30 of array 28. As shown in FIG. 3A, a sensing site 30 is comprised of a semiconductor substrate 37, which is InSb in the preferred embodiment, oxide layer 39 which is silicon oxynitride. A receiver electrode 41 forms with oxide layer 39 and substrate 37, the receiver capacitor 32; and similarly a transfer electrode 45, X storage electrode 43 and a Y storage electrode (not shown) form with oxide layer 39 and substrate 37 the transfer capacitor 35, X storage capacitor 33 and Y storage capacitor 44, respectively.

The operation of a site 30 will now be schematically described by reference to potential well diagrams to illustrate the depletion region created by the negative potential placed on the respective electrodes of each MIS capacitor.

Figure 3E:
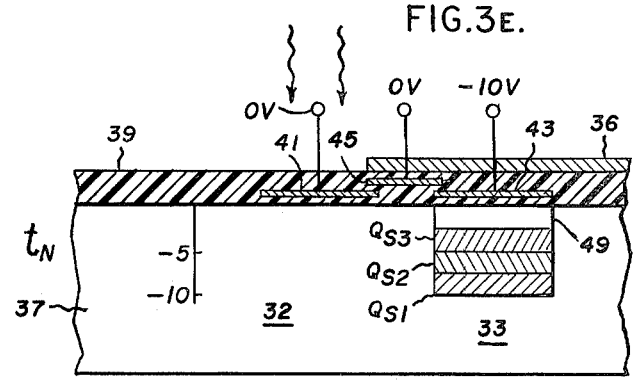

It can be noted initially that the time sequenced operation illustrated in FIGS. 3A–3D (times $t_1$ through $t_4$, respectively) is defined as one storage cycle of a sensing site 30. FIG. 3E (time $t_N$) illustrates the operational condition of the sensing site 30 after a plurality of consecutive storage cycles. The total integration time in terms of FIGS. 3A–3E for a sensing site is defined as $t_N-t_1$.

At a time $t_1$ (FIG. 3A), potential wells 47, 49 corresponding to receiver capacitor 32 and X storage capacitor 33 are biased to negative potentials, e.g., of $-10$ volts, for purposes of illustration, respectively. The surface area of oxide layer 39 surrounding the electrode 41 is exposed to photon radiation composed of background and signal radiation, thereby to create a composite quantity of minority charge carriers.

At time $t_2$ (FIG. 3B), quantities of charge $Q_B$ (5 volts) and $Q_{S_1}$ (2 volts), corresponding to background and signal-created charge, are stored in well 47. It should be noted that, although storage electrode 43 is also at a $-10$ volt potential, no charge is stored in the potential well 49 because X storage capacitor 33 is optically insensitive due to the opaque layer 36. Also, the transfer electrode 45 at times $t_1$ and $t_2$ (FIGS. 3A, 3B) has no potential thereon, thereby to prevent the transferring of charge from storage well 47 to storage well 49.

At a time $t_3$ (FIG. 3C), the potential on transfer electrode 45 is lowered to a $-5$ volts, the magnitude of the potential being determined by the amount of background charge which is to remain in receiver capacitor 32 and thus permit substantially only $Q_{S_1}$ to be transferred to potential well 49. In the case of high levels of background radiation, the transfer electrode potential is adjusted to be small, and for low levels of background, the transfer electrode potential is adjusted to be high.

At a time $t_4$ (FIG. 3D), the potentials on receiver electrodes 41 and transfer electrode 45 are lowered to zero volts, which isolates the charge $Q_{S_1}$ in potential well 49 and injects the charge $Q_b$ into the substrate 37 where it recombines with majority carriers. To insure complete isolation of charges $Q_B$ and $Q_{S_1}$, it is preferred to change the potential on transfer electrode 45 to zero volts prior to the removal of the potential on receiver electrode 41. Thus, at time $t_4$ (FIG. 3D), the storage unit 30 has completed one storage cycle, thereby to store a quantity of charge $Q_{S_1}$ in potential well 49, which corresponds essentially only to the signal radiation incident on optically sensitive receiver capacitor 32.

Because the X storage capacitor 33 is optically insensitive and thereby prevents background charge from accumulating in potential well 49, the dynamic range of the capacitor 33 and thus of the sensing sites of array 28 is dramatically increased for IR detection. For IR radiation, this is quite significant because the $Q_{S_1}$, in actuality, may only be about 1% of the total composite charge ($Q_B + Q_S$) generated in response to incident radiation from a sense. It will be clear that for IR radiation the signal charge $Q_S$ will always be significantly less than storage capacity or saturation level of well 49.

In accordance with the features of this invention, it is now possible to repetitively cycle sensing site 30 through a plurality of storage cycles, and at a time $t_N$ (FIG. 3E), a plurality of signal charges $Q_{s_1}$, $Q_{s_2}$ ... $Q_{s_P}$ can be stored in potential well 49 (shown herein for P=3) and thereafter read out. Therefore, the integration time (time $t_N-t_1$) that a sensing site is cycled to cumulatively store signal charges $Q_S$ is primarily determined by the magnitude of dark leakage current. (It will be understood, of course, that the integration time is determined by the magnitude of the signal charges $Q_S$ being stored and the saturation level of the potential well 49 in addition to the level of dark leakage current). This is in marked contrast to prior art IR systems which are limited primarily by the level of background radiation, which is many times larger than the signal radiation, and secondarily limited by dark leakage current for an array of MIS capacitors having the same saturation level. In the foregoing example, the bias voltage, as well as the values chosen for the background and signal charges, have been selected for purpose of illustration and do not necessarily represent actual values. To determine the bias voltage for the transfer electrode 45, the actual amount of background charge is determined by independent measurements or empirically by viewing a visual display of the video signal on a monitor and adjusting the bias voltages of the transfer electrode until the desired contrast is obtained, Ideally, this would be a value such that only the background charge remains stored under the receiver electrode during any one storage cycle. However, in actual practice, it may not be possible to precisely match the bias to store only the background charge, and, therefore, the bias is usually selected so that a slight amount of background charge is transferred with the signal charge to the X storage capacitor 33.

It should be further understood that the transfer of the signal charges $Q_{s_1}$, $Q_{s_2}$ ... $Q_{s_P}$ into only the X storage capacitor 33 has been done only for purposes of illustration. In actuality, as can be seen by viewing FIG. 2, and with properly chosen biases for the X and Y storage capacitors 33, 44, it is possible to either transfer the signal charge initially completely either into the X storage capacitor 33 (as shown), or into the Y storage capacitor 44, or into both the X and Y storage capacitors 33, 44, simultaneously.

It will be apparent that it is immaterial where the charge is initially stored because the X and Y storage capacitors 33, 44 are designed to maintain the charge in the depletion region of one storage capacitor when the bias is removed from the other so that the charge can be transferred back and forth between them. Signal read-out by injection only occurs when the bias on both the X and Y storage capacitors 33, 44 are switched off. As previously discussed hereinbefore, the read-out for a two-dimensional array is described in detail in the aforementioned Michon patent at Column 8, line 49 through Column 9, line 62.

Figure 4:
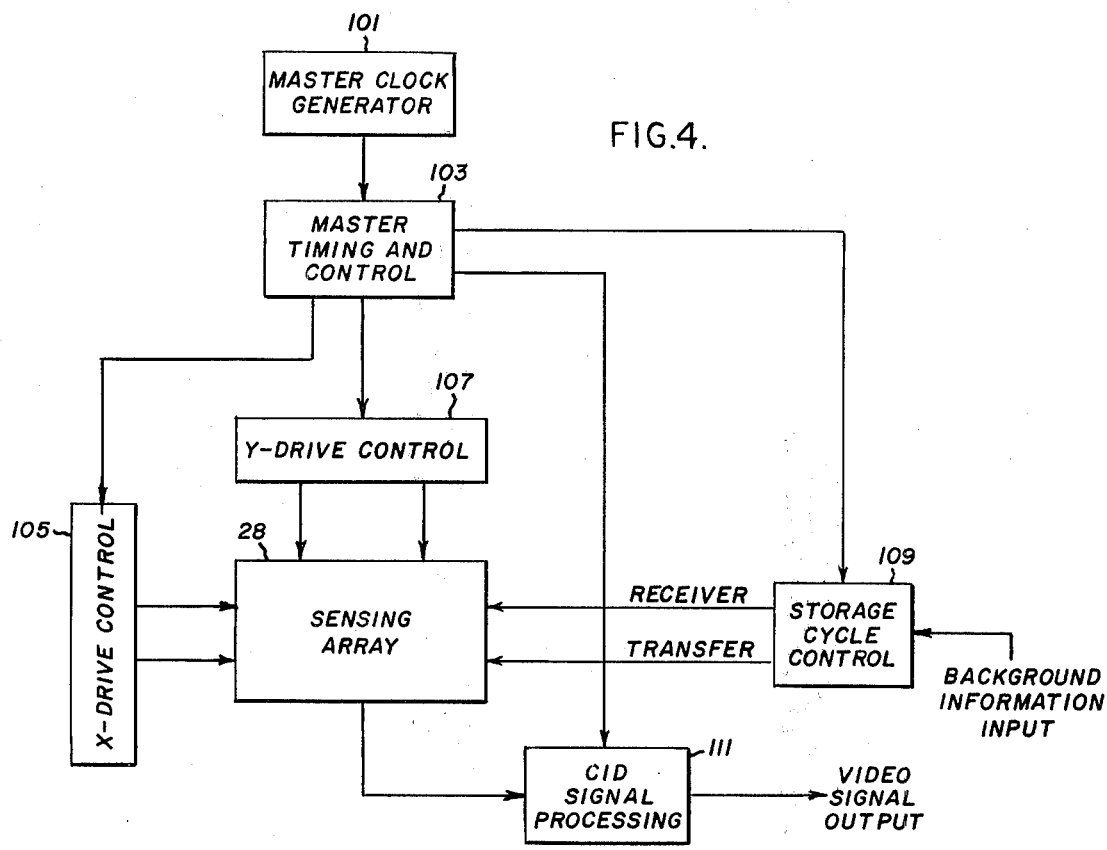
FIG. 4 is a block diagram of an infrared imager incorporating the CID sensing array of FIG. 2.

Referring now to FIG. 4, there is shown a simplified block diagram of an imaging system including an exemplary two-by-two section of the image sensing array 28 of FIG. 2 for providing an intermittent video signal output responsive to radiation imaged on the array 28, for example, by a lens system (not shown). The system includes a master clock generator 101 which provides a series of regularly occurring pulses of short duration for timing the operation of a master timing and control circuit 103 which, in turn, functions to coordinate the opertion of X and Y-drive control circuits 105, 107, a storage cycle control circuit 109 and a CID signal processing circuit 111.

In brief, the storage cycle control circuit 109 cycles each sensing site 30 through a plurality of storage cycles, during which time the CID signal processing circuit is inoperative; and following this, the X and Y-drive control circuits 105, 107 are operated to scan the array 28 to read-out the stored signal charge in each sensing site 30 for processing by the CID signal process circuit 111.

In more detail, the master timing and control circuit 103 simultaneously provides an activation signal to the storage cycle control circuit 109 and to the X and Y drive control circuits 105, 107 such that each sensing site is cycled through a predetermined plurality of storage cycles as explained in connection with FIGS. 3A–3E. The bias on the receiver and transfer capacitor 32, 35 is provided by an input from the storage cycle control circuit 109 and the bias on the storage capacitors 33, 44 is provided by an input from the X and Y drive control circuits 105, 107, resepectively. As stated hereinabove, a storage cycle for a sensing site 30 consists of biasing the optically sensitive receiver capacitor 32 and the optically insensitive storage capacitors 33, 44, respectively, to e.g. $-10$ volts, thereby to store a composite charge comprised of a signal charge and a background charge component on receiver capacitor 32. Next, the storage cycle control circuit 109 provides an appropriate input bias to the transfer capacitor 35 to permit the transfer of substantially only the signal charge component (e.g., $Q_{s_1}$, FIG 3C) of the composite charge to the X and Y storage capacitors 33, 44.

To eliminate the background charge component and to prepare for a second storage cycle, the bias on the receiver and transfer capacitors 32, 35 is then reduced so that the background charge component $Q_B$ of the composite charge is injected into the substrate 37 and recombined with majority carriers. The appropriate bias to be placed on the transfer capacitor 35 can either be measured or empirically determined by viewing a visual display, such as a cathode ray tube (not shown), of the video output signal produced by the sensing array 28. The input of the background information is provided as input into storage cycle control circuit 109 to adjust the bias control for transfer electrode 45 and the initial integration time, per storage cycle, for the incident radiation on the receiver capacitor 32.

In this manner, each sensing site is repetitively cycled through a predetermined plurality of storage cycles to store successive signal charge components in the X and Y storage capacitors 33, 44. During this "integration" time (e.g., $t_N-t_1$, FIG. 3E) the signal processing circuit 111 is inactivated responsive to an appropriate signal from master timing and control circuit 103. This is necessary to permit the elimination of the background charge component as well as to allow time for the sensing sites to be storage cycle to accumulate a signal charge of a large magnitude in the storage capacitors 33, 44.

After the sensing sites 30 have been cycled through a plurality of storage cycles, the X and Y drive control circuits are activated responsive to the master timing and control circuit 103 to scan the sensing sites 30 of array 28 to provide a read-out of the stored signal charge. During read-out, the storage cycle control circuit is activated in response to master timing and control circuit 103 to provide a zero bias on all receiver and transfer capacitors 32, 35. This acts to isolate the stored signal charge in the storage capacitors 33, 44. The output signal from the sensing array 28 is then provided as an input into a CID signal processing circuit 111 for transformation into a video signal output. The system then continues to operate in the foregoing manner by a cessation of the video signal output while the sensing array is cycled through a plurality of storage cycles followed by the scanning of the sensing array to again provide a video signal output corresponding to the stored signal charge.

The design and operation of the foregoing scanning and control circuits are well known to those skilled in the art, and the details of such structure provide no part of the invention herein. Reference can be made, for example, to the aforementioned Michon patent and to U.S. Pat. No. 3,840,740—Stewart, patented Oct. 8, 1974, and assigned to the assignee of the invention herein, for the details of operation of typical scanning and control circuits. It will be understood, of course, that the invention hereiin provides the additional features of the storage cycle control circuit 109 and the intermittent video signal output, which features can also be provided by such circuits with minor modifications which will be apparent to those skilled in the art.

Alternate techniques for scanning a CID array and processing the signal from the array into a video signal output are also disclosed in a U.S. patent application, Ser. No. 441,054—Eichelberger et al., entitled "Apparatus for Sensing Radiation and Providing Electric Readout" filed Feb. 11, 1974, and assigned to the assignee of the invention herein, which techniques could alternatively be used herein.

As will be recognized by those skilled in the art, increasing of the dynamic range and lengthening of the integration time for a sensing site in an infrared imager is desirable, regardless of the type of scanning or signal detection used. Thus, in accordance with this invention, the dynamic range and integration time of sensing sites in a CCD sensing array can be enhanced.

Figure 5:
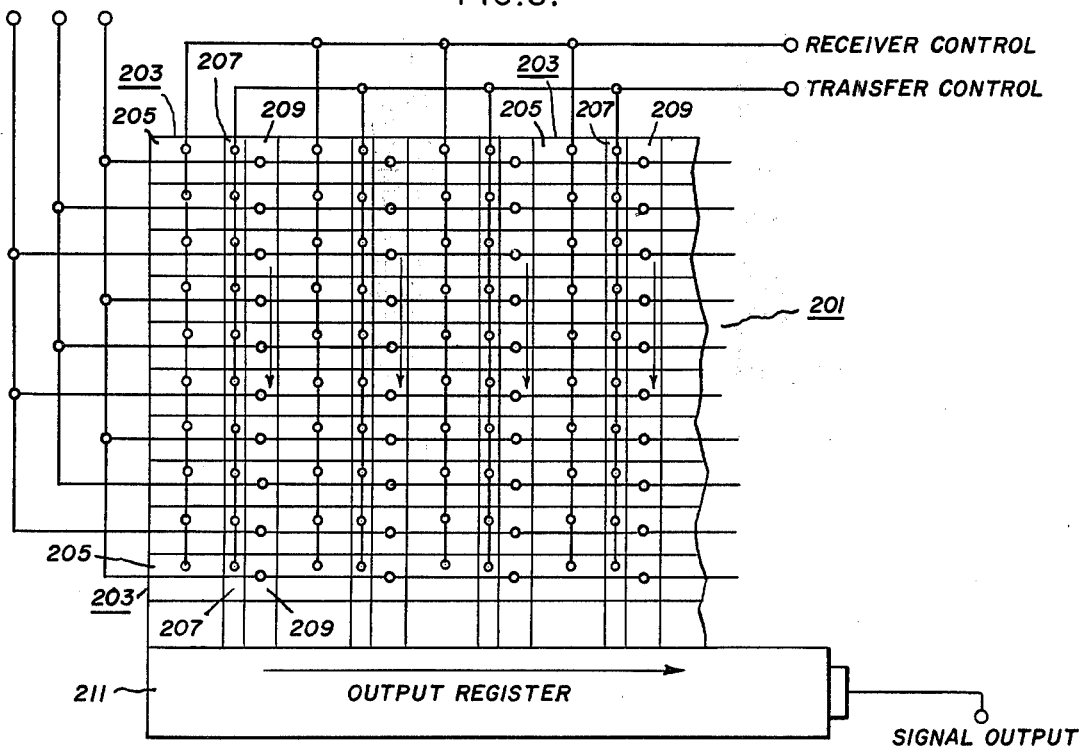
FIG. 5 is a schematic diagram of an infrared imager incorporating a CCD sensing array constructed in accordance with an alternate embodiment of the invention.

Referring now to FIG. 5, a section of a CCD sensing array 201 for providing a video output signal in response to radiation imaged on the array 201 in accordance with well known techniques is shown. The system comprises the array 201 of sensing sites 203 which are arranged in rows. Each sensing is comprised of an MIS optically sensitive capacitor 205, an optically insensitive transfer capacitor 207, and an optically insensitive storage capacitor 209. The adjacent sensing sites in each row are isolatted from one another by doped channel stops (not shown) as is well known. The adjacent receiver capacitors 205 and adjacent transfer capacitors 207 in adjacent rows are similarly isolated. The adjacent storage capacitors 209 are arranged in columns and are coupled so as to permit charge transfer therealong. The construction and operation of each sensing site 203 is identical to that explained in connection with FIGS. 2 and 3A–3E hereinabove, with the exception that only one storage capacitor 209 is provided in the CCD embodiment of FIG. 5 whereas in the CID embodiment of FIG. 2, two storage capacitors, X and Y storage capacitors 33, 44, are required.

The operation of the CCD imaging system as a whole is analogous to that described in connection with the CID system of FIG. 4, with the exception that the readout is provided in accordance with well known CCD multiphase clocking techniques. In particular, a storage cycle control circuit (not shown) can be provided to cycle each CCD sensing site 203 through a plurality of storage cycles, resulting in the storage of a plurality of signal charge components in the storage capacitor 209. Each storage capacitor 209, as can be seen, provides one electrode of a linear column of electrodes in a CCD linear array of electrodes adapted for three-phase transfer of stored charge down each column into an output shift register 211. Other polyphase clocking systems can, of course, be used also.

Shift register techniques normally used to read-out CCD arrays may be employed by modifying the timing controls to provide for the intermittent video signal output similar to the operation explained in FIG. 4. As discussed hereinbefore, there is no video signal output during the time required for the storage cycling of the sensing sites, after which the stored charge in each storage capacitor is then read out. Then the shift register is used to transfer the signal charge to provide video signal output.

As can be seen, the features of this invention are equally applicable to a CCD imaging system, as well as a CID imaging system, to provide an infrared with an improved dynamic range and a longer integration time than was heretofore possible with prior art IR imagers. As stated hereinbefore, the critical feature of this invention is that the integration time for the sensing sites of the sensing arrays is no longer dependent upon the level of background radiation because the signal charge is repetitively stored in an optically insensitive storage capacitor to provide a large signal output substantially free of noise due to background charge.

While the invention has been shown and described with respect to specific embodiments thereof, it is not intended to be limited to the particular forms shown and described. Accordingly, the appended claims are intended to cover all modifications within the spirit and scope of the invention herein described.

What I claim as new and desire to secure by Letters Patent of the United States is:

1. A CID sensing array of sensing sites, each sensing site comprising:
   a. an optically sensitive receiver MIS capacitor for receiving incident radiation from a scene and storing signal and background charge corresponding to said incident radiation thereon;
   b. a pair of optically insensitive MIS storage capacitors, said storage capacitors being coupled together, one of said pair being an X-storage capacitor and the other of said pair a Y-storage capacitor, and
   c. an optically insensitive transfer control MIS capacitor disposed in an overlapping manner between and coupled to said receiver capacitor and to said pair of storage capacitors for controlling the transfer of charge between said receiver and storage capacitors,
   d. and wherein said array is comprised of a two-dimensional array of sensing sites having rows of X-storage capacitors and columns of Y-storage capacitors.

2. The array of claim 1 further comprising first terminal line means for simultaneously and equally biasing the X storage capacitors of each said row, one row at a time, and second terminal line means for simultaneously and equally biasing the Y-storage capacitors of each said one column at a time; third terminal line means for simultaneously and equally biasing the receiver capacitors of each said sensing site; and fourth terminal line means for simultaneously and equally biasing the transfer capacitors of each said sensing site.

3. An imaging system comprising:
   a. an array of radiation sensing sites, each site comprising:
      1. an optically sensitive receiver MIS capacitor for receiving incident radiation from a scene and storing signal and background charge corresponding to incident radiation thereon;
      2. an optically insensitive storage MIS capacitor for storing charge transferred from said receiver capacitor;
      3. an optically insensitive transfer control MIS capacitor disposed between and coupled to said receiver capacitor and to said storage capacitor for controlling the transfer of charge between said receiver and storage capacitor;
   b. a storage cycle control means:
      1. for transferring a first quantity of chage substantially corresponding to said signal charge to said storage capacitor;
      2. for retaining storage of a second quantity of charge substantially corresponding to background charge on said receiver capacitor; and
      3. for discharging said second quantity from said receiver capacitor subsequent to the transfer of said first quantity, thereby to complete one storage cycle for each said sensing site; and
      4. for cycling each said sensing site through a predetermined plurality of storage cycles; and
   c. drive control circuit means for discharging the stored charge from the storage capacitor of each said sensing site after said sensing sites have been cycled through said plurality of storage cycles.

4. The system of claim 3 wherein said sites are formed in an InSb semiconductor material.

5. The system of claim 3 wherein the stored charge discharge from said storage capacitor is injected into the substrate of the storage capacitor, said system further comprising signal processing means for integrating a displacement current induced in said substrate by the injected charge.

6. The system of claim 5 wherein said sites are arranged in a two-dimensional array of rows and columns and said drive control means further comprises X and Y-drive control means for scanning said array.

* * * * *